(12) United States Patent
Ida

(10) Patent No.: US 12,424,407 B2
(45) Date of Patent: Sep. 23, 2025

(54) INSPECTION DEVICE AND INSPECTION METHOD

(71) Applicant: Kioxia Corporation, Tokyo (JP)

(72) Inventor: Chihiro Ida, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 480 days.

(21) Appl. No.: 18/077,635

(22) Filed: Dec. 8, 2022

(65) Prior Publication Data

US 2024/0055223 A1 Feb. 15, 2024

(30) Foreign Application Priority Data

Aug. 10, 2022 (JP) .................................. 2022-128499

(51) Int. Cl.
*H01J 37/28* (2006.01)
*H01J 37/147* (2006.01)
(Continued)

(52) U.S. Cl.
CPC .......... *H01J 37/28* (2013.01); *H01J 37/1474* (2013.01); *H01J 37/222* (2013.01); *H01J 37/244* (2013.01);
(Continued)

(58) Field of Classification Search
CPC .. H01J 37/00; H01J 37/02; H01J 37/26; H01J 37/28; H01J 37/1474; H01J 37/222;
(Continued)

(56) References Cited

U.S. PATENT DOCUMENTS 9,236,218 B2 1/2016 Murakawa et al.
10,060,947 B2 8/2018 Budach et al.
(Continued)

FOREIGN PATENT DOCUMENTS

JP 2005-116795 A 4/2005
JP 2021-148557 A 9/2021

*Primary Examiner* — Jason L McCormack
(74) *Attorney, Agent, or Firm* — Foley & Lardner LLP

(57) ABSTRACT

An inspection device includes an emission unit of first charging particles. A deflection unit deflects the first charging particles to scan a surface of a target object with the first charging particles. A detection unit detects second charging particles generated from the surface of the target object receiving the first charging particles. An image generation unit generates an image of the surface of the target object based on a detection result of the second charging particles by the detection unit. A control unit controls a scan direction of the first charging particles. A calculation unit detects normal directions to a contour of an uneven portion on the surface of the target object in a first image obtained by scanning in a first scan direction. The calculation unit calculates a frequency of a first angle formed between a reference axis of the first image and a normal direction of each of a plurality of unit regions. The calculation unit determines the normal direction corresponding to a most frequent value of the first angle among the normal directions as a second scan direction. The calculation unit calculates a height of the uneven portion based on a second image obtained by scanning in the second scan direction.

20 Claims, 10 Drawing Sheets

(51) Int. Cl.
*H01J 37/22* (2006.01)
*H01J 37/244* (2006.01)
*H01J 37/26* (2006.01)

(52) U.S. Cl.
CPC ... *H01J 37/265* (2013.01); *H01J 2237/24578* (2013.01); *H01J 2237/24592* (2013.01); *H01J 2237/2817* (2013.01); *H01J 2237/30488* (2013.01)

(58) Field of Classification Search
CPC ...... H01J 37/244; H01J 37/265; H01J 37/263; H01J 2237/24578; H01J 2237/24592; H01J 2237/2817; H01J 2237/30488; H01J 2237/24465; H01J 2237/221

USPC .......................................... 250/306, 307, 311
See application file for complete search history.

(56) References Cited

U.S. PATENT DOCUMENTS

| | | | |
|---|---|---|---|
| 10,866,197 | B2 | 12/2020 | Tolani et al. |
| 2005/0116164 | A1* | 6/2005 | Goldenshtein ......... G01N 23/22 250/311 |
| 2005/0121610 | A1 | 6/2005 | Abe |
| 2013/0223723 | A1* | 8/2013 | Shibahara ............. G01B 21/20 382/145 |
| 2020/0309721 | A1* | 10/2020 | Han ................... G01N 23/2251 |

* cited by examiner

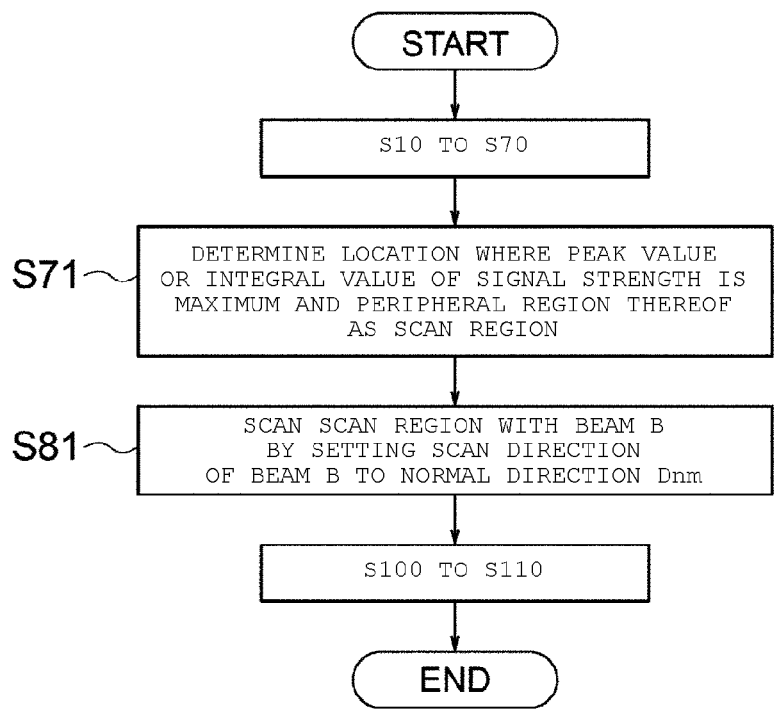

INSPECTION DEVICE AND INSPECTION METHOD

CROSS-REFERENCE TO RELATED APPLICATION(S)

This application is based upon and claims the benefit of priority from Japanese Patent Application No. 2022-128499, filed Aug. 10, 2022, the entire contents of which are incorporated herein by reference.

FIELD

Embodiments described herein relate generally to an inspection device and an inspection method.

BACKGROUND

When observing a surface of an inspection target by an inspection device such as a scanning electron microscope (SEM), an inspection device irradiates the inspection target with an electron beam to detect secondary electrons, reflected electrons, and backscattered electrons (hereinafter, referred to as secondary electrons and the like) generated from the surface of the inspection target and generates an image (a SEM image).

However, in an inspection device of related art, it is difficult to accurately calculate a height of a protrusion portion on a surface of the inspection target using the SEM image.

DESCRIPTION OF THE DRAWINGS

FIG. 17 is a flowchart showing an example of an inspection method according to a second embodiment.

DETAILED DESCRIPTION

Figure 1:
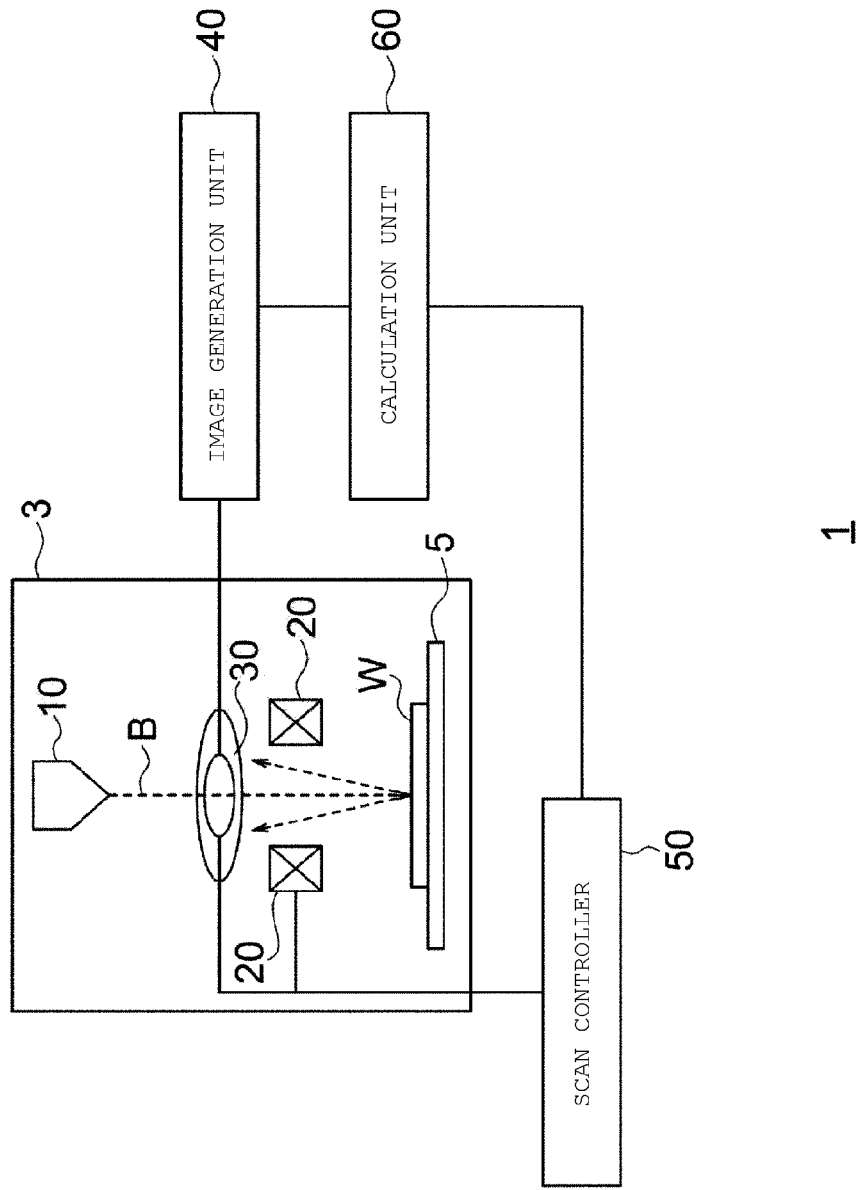
FIG. 1 is a block diagram showing a configuration example of an inspection device according to a first embodiment.

In general, according to one embodiment, an inspection device includes an emission unit (emitter) that emits first charging particles. A deflection unit (deflector) deflects the first charging particles to scan a surface of a target object with the first charging particles. A detection unit (detector) detects second charging particles generated from the surface of the target object based on receiving the first charging particles. An image generation unit (generator) generates an image of the surface of the target object based on a detection result of the second charging particles by the detection unit. A control unit (controller) controls a scan direction of the first charging particles. A calculation unit (processing circuit) detects normal directions to a contour of an uneven portion on the surface of the target object in a first image obtained by scanning the surface of the target object with the first charging particles in a first scan direction for a plurality of unit regions of the first image. The calculation unit calculates a frequency of a first angle formed between a reference axis of the first image and a normal direction of each of the plurality of unit regions. The calculation unit determines the normal direction corresponding to a most frequent value of the first angle among the normal directions as a second scan direction. The calculation unit calculates a height of the uneven portion based on a second image obtained by scanning the surface of the target object with the first charging particles in the second scan direction.

Hereinafter, embodiments according to the present disclosure will be described with reference to the drawings. The present embodiments do not limit the present disclosure. The drawings are schematic or conceptual, and a ratio and the like of respective portions are not necessarily the same as actual ratio and the like. In the specification and drawings, the same reference numerals are attached to the same elements as described above for the previous drawings, and detailed descriptions thereof are omitted as appropriate.

FIG. 1 is a block diagram showing a configuration example of an inspection device 1 according to a first embodiment. The inspection device 1 is, for example, a charging particle irradiation device such as a SEM and may be a defect review (DR)-SEM that detects defects on a semiconductor wafer W from an image. The inspection device 1 includes a housing 3, a stage 5, an emission unit 10, a deflector 20, a detector 30, an image generation unit 40, a scan controller 50, and a calculation unit 60.

The housing 3 accommodates the stage 5, the emission unit 10, the deflector 20 and the detector 30. The semiconductor wafer W (hereinafter, also simply referred to as a wafer W), which is an inspection target and carried into the housing 3, can be placed on the stage 5.

The emission unit 10 generates a charging particle beam and emits the charging particle beam onto the wafer W on the stage 5. A charging particle beam B (hereinafter, also simply referred to as a beam B) may be charging particles such as an electron beam or an ion beam.

The deflector 20 deflects the beam B and scans a surface of the wafer W with the beam B. For example, the deflector 20 sets the surface of the wafer W (or the stage 5) as an X-Y plane and scans the surface of the wafer W with the beam B in the X direction while shifting the beam B in the Y direction by a predetermined interval (see FIG. 4). Thereby, the deflector 20 can scan almost the entire surface of the wafer W with the beam B. In this way, the deflector 20 performs a so-called raster scan. An X axis and a Y axis may be coordinate axes orthogonal to each other.

The detector 30 detects secondary electrons, reflected electrons, and backscattered electrons (hereinafter, also referred to as secondary electrons and the like) generated from the surface of the wafer W receiving the beam B. When the wafer W is irradiated with the beam B, secondary electrons and the like are generated from the surface of the wafer W. The secondary electrons and the like fly in a direction dependent on an uneven pattern of the wafer W. The detector 30 has, for example, an annular shape with a central hole through which the beam B passes. The detector 30 is divided into a plurality of detection elements, and each detection element can detect secondary electrons and the like independently. Thus, a signal strength of the secondary electrons and the like detected by each detection element of the detector 30 differs depending on flight directions of the secondary electrons and the like.

Figure 2:
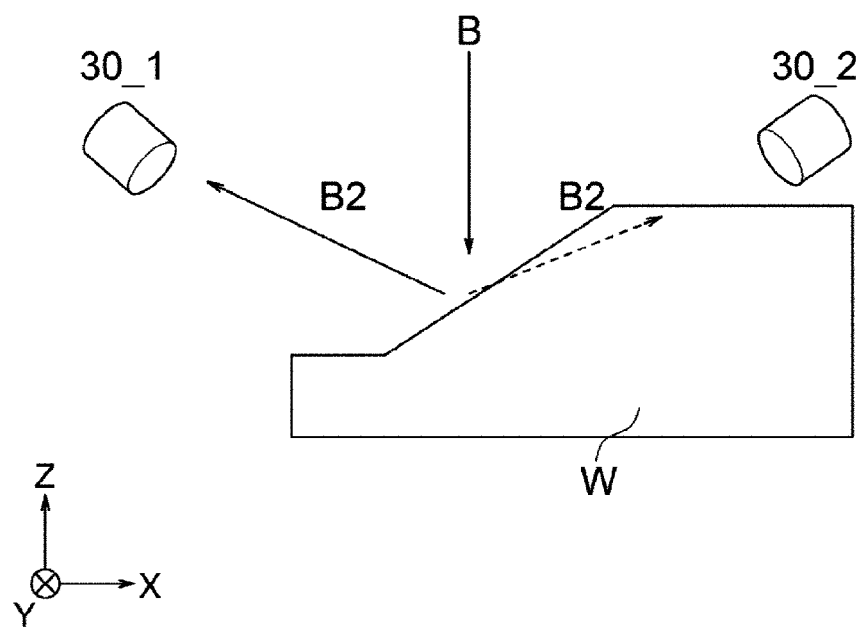
FIG. 2 is a conceptual diagram showing an example of a relationship between flight directions of secondary electrons and the like and a signal strength.
Figure 3:
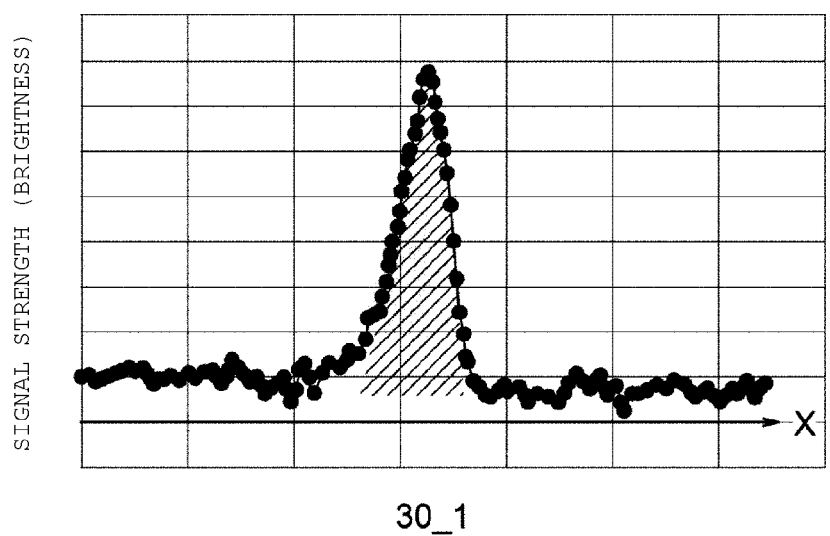
FIG. 3 is a spectrum of a signal strength (brightness) obtained by a detection element of a detector.

FIG. 2 is a conceptual diagram showing an example of a relationship between a flight direction of secondary electrons and the like and a signal strength. FIG. 3 is a spectrum of a signal strength (brightness) obtained by a detection element 30_1 of the detector 30. A vertical axis indicates a gradation value of a signal strength (brightness). A horizontal axis indicates a position of the beam B in the scan direction (the X direction).

When a surface of the wafer W has an uneven pattern as shown in FIG. 2 and the surface of the wafer W is irradiated with the beam B, secondary electrons and the like B2 fly mostly in a direction facing the inclined surface (a direction nearly perpendicular to an inclined surface) and do not fly much in a direction along the inclined surface (a direction nearly parallel to the inclined surface). Thus, in the example of FIG. 2, the secondary electrons and the like B2 fly mostly toward the detection element 30_1, and do not fly much toward the detection element 30_2. Thus, when the surface of the wafer W is scanned with the beam B in the X direction, a signal strength (brightness) obtained by the detection element 30_1 has a large peak as shown in FIG. 3. Meanwhile, although not shown, a signal strength (brightness) obtained by the detection element 30_2 has a spectrum with a profile that is the inverse of the spectrum shown in FIG. 3, and such a peak does not occur.

In this way, by measuring a signal strength of each of the detection elements 30_1 and 30_2 of the detector 30, a contour of an uneven pattern on a surface of the wafer W can be detected. Further, it is known that a height of a peak of the signal strength or an integral value of the signal strength is related to a height of the uneven pattern. Thus, the height of the uneven pattern can be calculated from the height of the peak of the signal strength or the integral value of the signal strength.

The uneven pattern is a defect caused by particles and the like and is, for example, an uneven portion generated on the wafer W. A height (depth) of the uneven portion can be calculated from the height of the peak of the signal strength or the integral value of the signal strength.

FIG. 1 is referred to again. The image generation unit 40 generates an image of the surface of the wafer W based on the detection result of secondary electrons and the like by the detector 30. The image generation unit 40 converts a signal strength of the secondary electrons and the like detected by the detector 30 into a two-dimensional image of the surface of the wafer W. Thereby, the detected amount (signal strength) of the secondary electrons and the like can be represented as brightness of the two-dimensional image.

The scan controller 50 controls a scan direction of the beam B by controlling the deflector 20. For example, the scan controller 50 performs a raster scan in one direction (the X direction) while irradiating the surface of the wafer W with the beam B. Thereby, the image generation unit 40 can obtain an image of the surface of the wafer W.

The calculation unit 60 acquires a contour shape of an uneven pattern on the surface of the wafer W using brightness (that is, a signal strength of secondary electrons and the like) of the image obtained by scanning the surface of the wafer W with the beam B. The contour shape of the uneven pattern can be extracted by, for example, binarization processing and image processing of a Laplacian filter, a Sobel filter, and the like. Further, the calculation unit 60 can calculate a height of the uneven pattern of the surface of the wafer W using a height of a brightness peak of the image or an integral value of the brightness of the image.

The image generation unit 40, the scan controller 50, and the calculation unit 60 may be configured with one central processing unit (CPU) or the like, and functions thereof may each be implemented by software. Alternatively, the image generation unit 40, the scan controller 50, and the calculation unit 60 may be configured with a plurality of CPUs or the like.

In at least one embodiment, the calculation unit 60 acquires a contour shape of the uneven pattern of the surface of the wafer W using a first image detected first of the surface of the wafer W and detects a normal direction of an outer edge of the contour shape. The calculation unit 60 calculates the most frequent value of an angle between the X axis and the normal direction. The image generation unit 40 acquires a second image of the uneven pattern by setting the normal direction corresponding to the most frequent value as a scan direction. Thereby, most of the scan direction of the beam B becomes the normal direction of the contour of the uneven pattern or a direction close thereto.

By performing a scan with the beam B in the normal direction of the contour of the uneven pattern, or in the direction close thereto, brightness (a signal strength of secondary electrons and the like) of an image sharply rises and a contrast of the image increases. That is, when a scan is performed with the beam B in the normal direction of the contour of the uneven pattern or in a direction close to the normal direction, a brightness peak of an image appears to be higher and clearer than in a case where a scan is performed in a direction parallel to the contour of the uneven pattern, and an integral value thereof also increases. Thereby, the calculation unit 60 can calculate a height of an uneven pattern on a surface of the wafer W more accurately.

Next, an inspection method using the inspection device 1 will be described.

Figure 10:
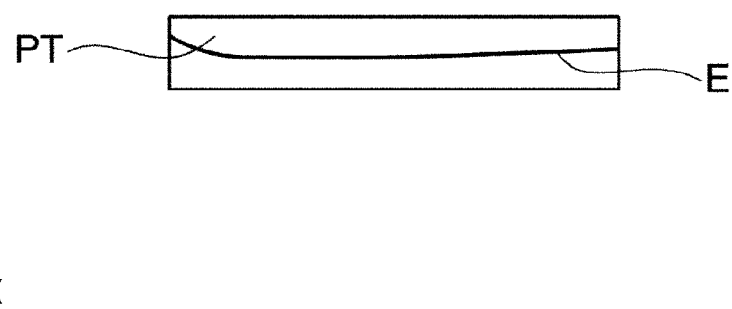
FIG. 10 is a diagram showing an example of the second image.
Figure 11:
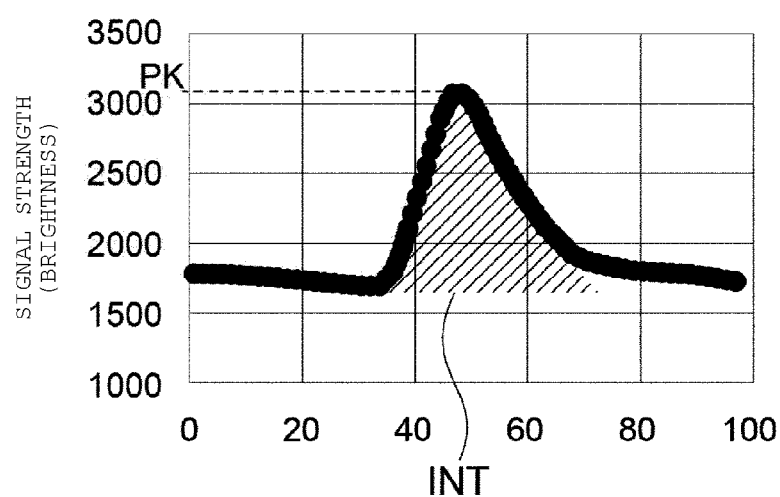
FIG. 11 is a spectrum of a signal strength (brightness) obtained when acquiring a second image.
Figure 12:
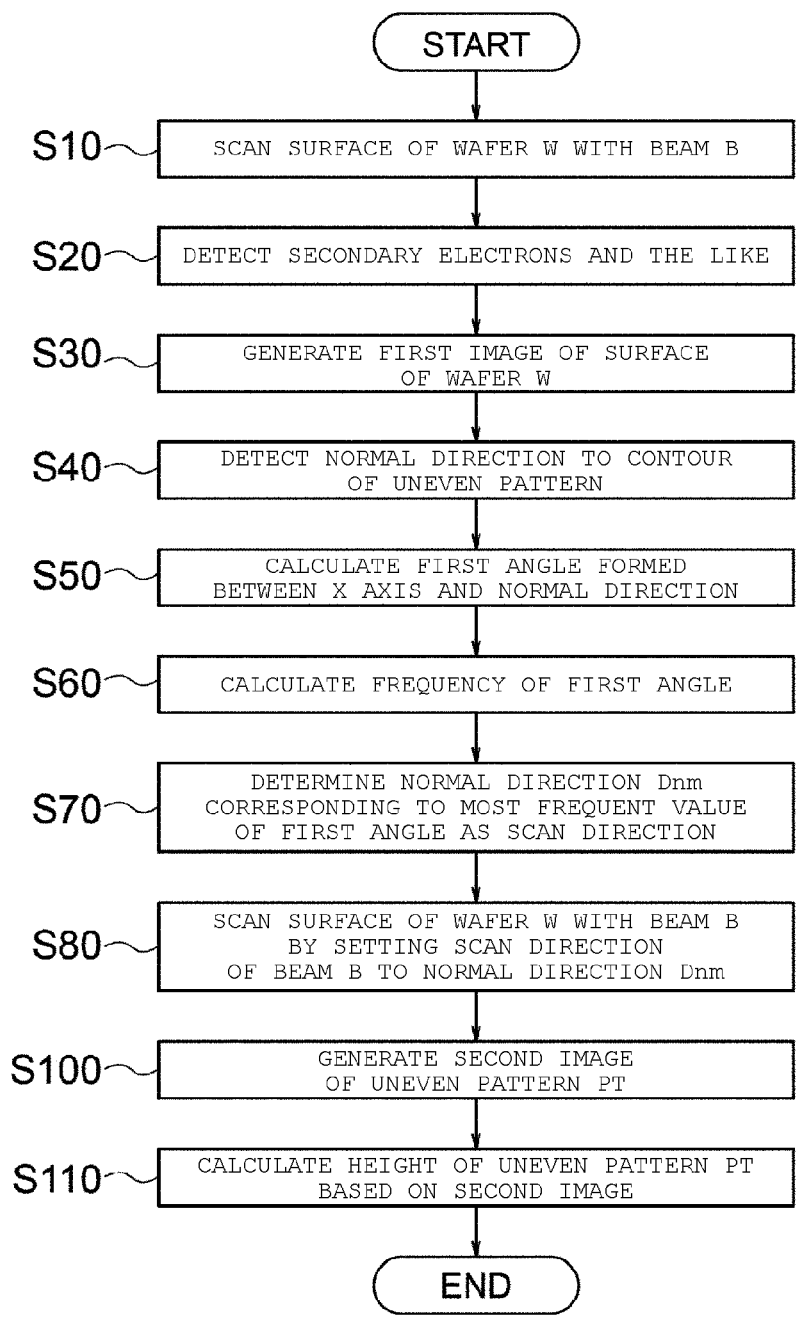
FIG. 12 is a flowchart showing an example of an inspection method according to the first embodiment.

FIGS. 4 to 11 are diagrams showing an example of an inspection method using the inspection device 1 according to the first embodiment. FIG. 12 is a flowchart showing an example of an inspection method according to the first embodiment.

Acquisition of First Image

First, the wafer W is carried into the housing 3 and placed on the stage 5. Next, the beam B is generated by the emission unit 10 and emitted to a surface of the wafer W. The beam B passes through a central opening of the detector 30 and is directed in a desired direction by the deflector 20, and the surface of the wafer W is irradiated with the beam B.

Figure 4:
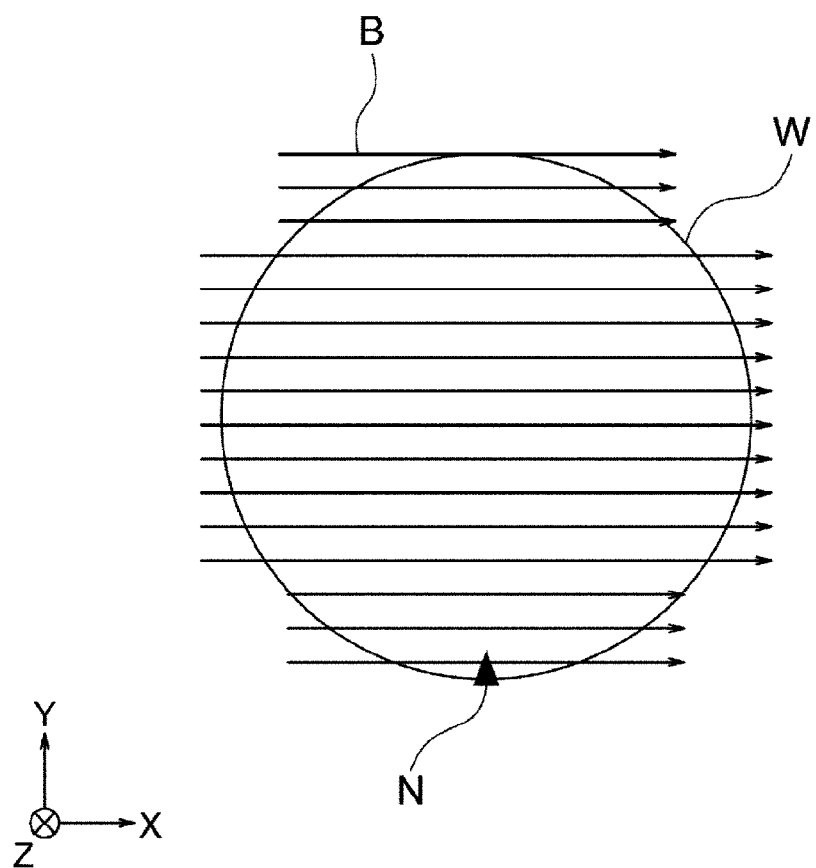
FIG. 4 is a diagram showing an example of an inspection method using the inspection device according to the first embodiment.

The deflector 20 deflects the beam B and scans the surface of the wafer W with the beam B (S10). The deflector 20 repeatedly scans the surface of the wafer W with the beam B in a scan direction (for example, the X direction). Each time the scan is performed with the beam B, the deflector 20 shifts the beam B in a direction (for example, the Y direction) orthogonal to the scan direction by a predetermined interval. In this case, the deflector 20 scans the surface of the wafer W with the beam B in the X direction, for example, as shown in FIG. 4, and then shifts the beam B from a scan start position by a predetermined interval in the Y direction during a blanking period of the beam B, and scans again the surface of the wafer W in the X direction with the beam B. By repeating this, the deflector 20 can raster-scan the entire surface of the wafer W with the beam B, as shown in FIG. 4. Although not limited in particular, in FIG. 4, a notch N of the wafer W is disposed in a −Y direction, and a right direction (a +X direction) to a direction in which the notch N faces is set as a scan direction.

Figure 5:
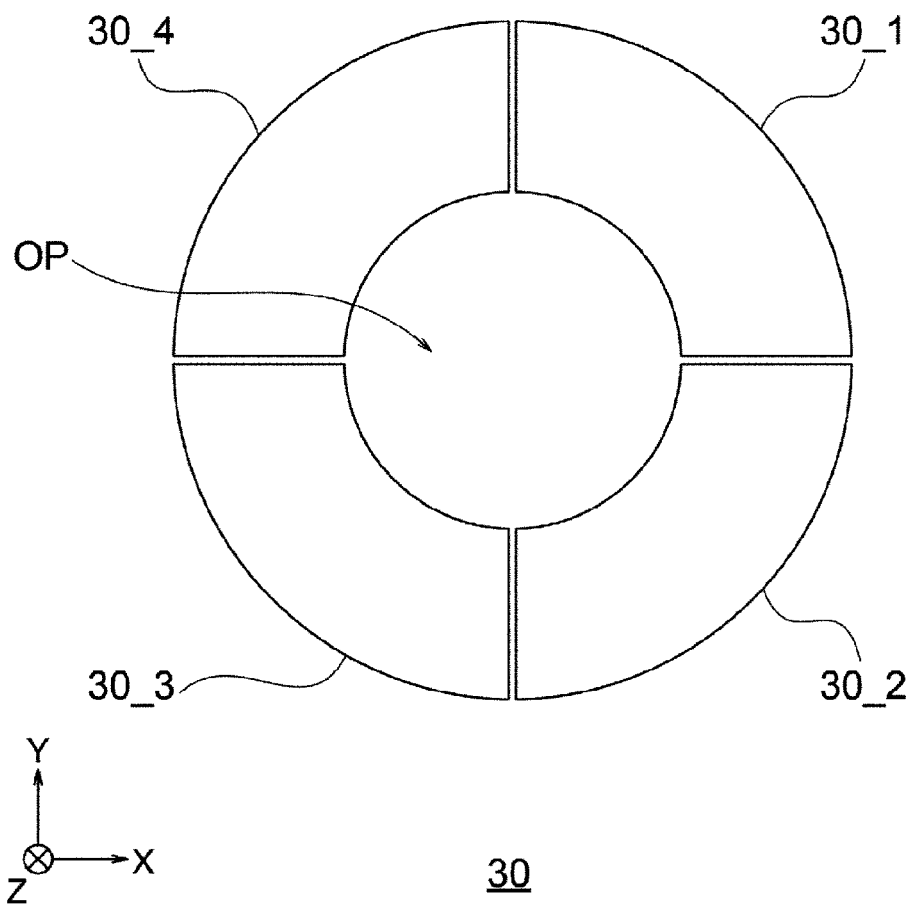
FIG. 5 is a plan view showing a configuration example of the detector.

Next, the detector 30 detects secondary electrons and the like generated from the surface of the wafer W receiving the beam B (S20). FIG. 5 is a plan view showing a configuration example of the detector 30. The detector 30 has, for example, a substantially annular shape and has an opening OP through which the beam B passes in the center. The detector 30 is configured in an annular shape such that the beam B can pass therethrough and secondary electrons and the like from the wafer W can be received at a vicinity of the wafer W. A plan shape of the detector 30 is not limited to an annular shape as long as the detector 30 can allow the beam B to pass therethrough and receive secondary electrons and the like.

The detector 30 is divided into a plurality of detection elements 30_1 to 30_4. In FIG. 5, the detector 30 is configured with four detection elements 30_1 to 30_4. However, the detector 30 may be configured with three or less detection elements or five or more detection elements.

The detection elements 30_1 to 30_4 can independently detect secondary electrons and the like. Depending on which one of the detection elements 30_1 to 30_4 has detected the secondary electrons and the like, a direction in which the secondary electrons and the like flew can be recognized to some extent.

Next, the image generation unit 40 generates a first image of the surface of the wafer W based on a detection result of the secondary electrons and the like (S30). The image generation unit 40 converts a signal strength of the secondary electrons and the like detected by the detector 30 into a two-dimensional image of the surface of the wafer W. Thereby, a detected amount of the secondary electrons and the like is represented as brightness of the two-dimensional image. In this case, in order to obtain the first image of the entire surface of the wafer W in a short time, image quality of the first image may be somewhat low.

Figure 6:
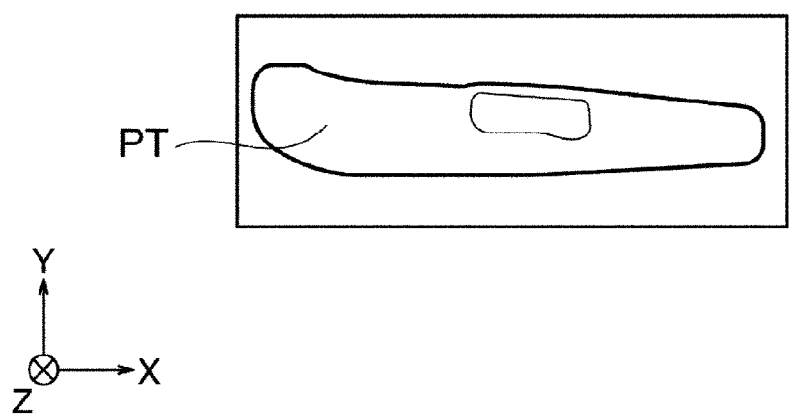
FIG. 6 is a diagram showing an example of a first image of an uneven pattern on a surface of a wafer.

For example, FIG. 6 is a diagram showing an example of a first image of an uneven pattern of the surface of the wafer W. When there is a defect caused by particles or the like on the wafer W, an uneven pattern PT appears on the surface of the wafer W as shown in FIG. 6. The calculation unit 60 detects a contour of the uneven pattern PT based on a peak value or an integral value of a signal strength (brightness) of the first image. A contour of the uneven pattern PT can be detected even when image quality of the first image is somewhat low. The image quality of the first image may be determined based on a relationship with acquisition time thereof.

Acquisition of Second Image

Figure 7:
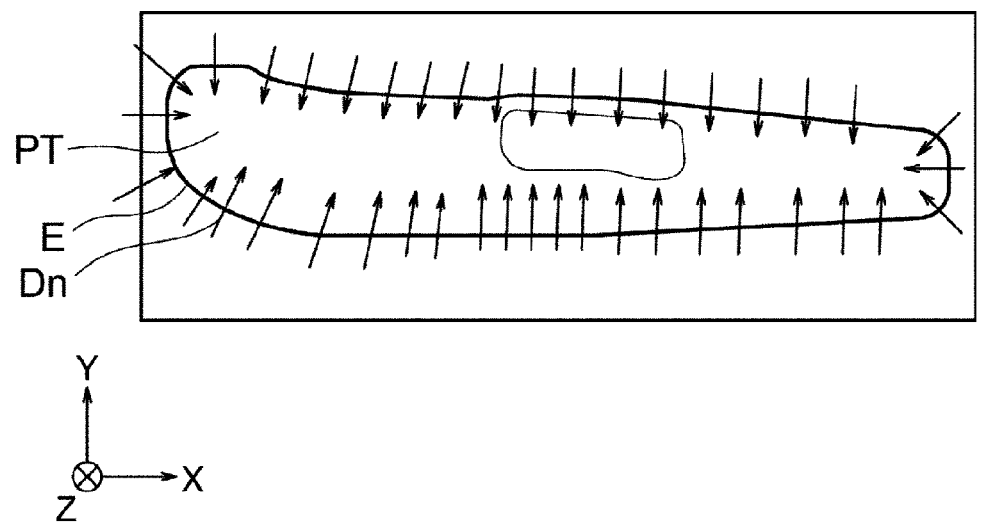
FIG. 7 is a conceptual diagram showing a normal direction to a contour of the uneven pattern.

Next, the calculation unit 60 detects a normal direction Dn to a contour (edge portion) E of the uneven pattern PT on the surface of the wafer W in the first image for each unit region of the first image (S40). FIG. 7 is a conceptual diagram showing the normal direction Dn to the contour of the uneven pattern PT. The normal direction Dn to the contour E of the uneven pattern PT is a direction orthogonal to a line segment of the contour E in each unit region of the first image. The unit region may be a region defined by each pixel of the first image or may be a region configured with a plurality of adjacent pixels. Furthermore, the unit region may be in any range within an X-Y plane of the first image, regardless of pixels. Further, when the line segment of the contour E is a curved line within the unit region, the normal direction Dn may be a direction orthogonal to a tangent of any point of the line segment of the contour E. The normal direction Dn may be directed from the outside of a contour of an uneven pattern to the inside thereof, or vice versa.

Figure 8:
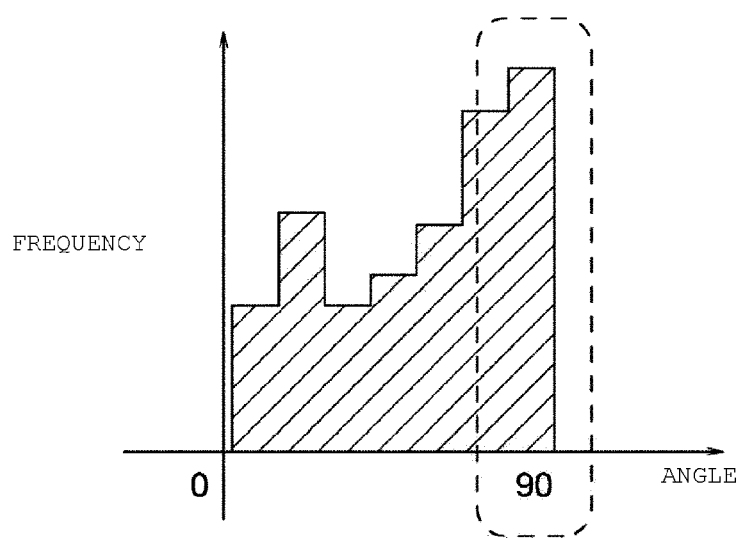
FIG. 8 is a histogram showing a frequency of a first angle.

Next, the calculation unit 60 calculates a first angle between the X axis of the first image and the normal direction Dn of each unit region (S50). Furthermore, the calculation unit 60 calculates a frequency of the first angle (S60). FIG. 8 is a histogram showing the frequency of the first angle. A vertical axis represents a frequency of the first angle. A horizontal axis represents segments of the first angle. The segments of the first angle may have any angular interval. For example, intervals of the segments of the first angle may be every n degrees (0<n≤90). The first angle may be an angle between a certain axis in a two-dimensional plane (X-Y plane) of the first image and the normal direction Dn, and may be, for example, an angle between the Y axis and the normal direction Dn.

Next, the calculation unit 60 determines a normal direction Dnm corresponding to the most frequent value of the first angle among the normal directions Dn as the scan direction (S70). For example, as shown in FIG. 8, when the most frequent value of the first angle in the histogram of the first angles is 90 degrees, the calculation unit 60 determines the normal direction Dnm in which the first angle is 90 degrees as a next scan direction.

Figure 9:
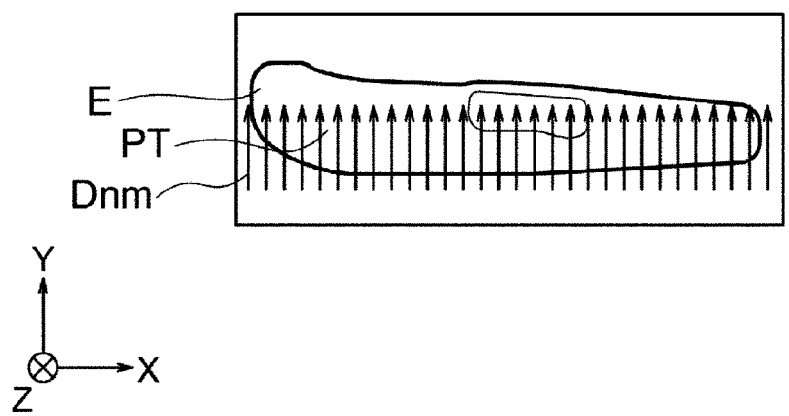
FIG. 9 is a diagram showing an example of a scan direction of a beam when acquiring a second image.

Next, the scan controller 50 sets the scan direction of the beam B to the normal direction Dnm. The deflector 20 deflects the beam B according to an instruction from the scan controller 50 and scans the surface of the wafer W with the beam B in the normal direction Dnm (S80). FIG. 9 is a diagram showing an example of a scan direction of the beam B when acquiring a second image. For example, the deflector 20 raster-scans at least a partial region of the uneven pattern PT on the surface of the wafer W with the beam B in the normal direction Dnm. The deflector 20 repeatedly scans the surface of the wafer W with the beam B in the scan direction (for example, the Y direction). Each time a scan is performed with the beam B, the deflector 20 shifts the beam B by a predetermined interval in a direction (for example, the X direction) orthogonal to the scan direction. In this case, because the scan direction is the normal direction Dnm corresponding to the most frequent value of the first angle, the deflector 20 scans the contour E of the uneven pattern PT with the beam B in the normal direction Dn or in a direction close to the normal direction Dn. Thus, when the contour E of the uneven pattern PT has an elongated shape, a scan direction when acquiring the second image is set to a direction substantially orthogonal to a longitudinal direction of the uneven pattern PT. Thereby, a height of a peak of a signal strength (brightness) at the contour E of the uneven pattern PT or an integral value thereof increases. Further, the deflector 20 scans the surface of the wafer W with the beam B only for the region of the uneven pattern PT. Thereby, the image generation unit 40 can acquire the second image of the uneven pattern PT with high image quality in a short time. The first image may have image quality sufficient to detect the contour of the uneven pattern PT, but the second image is desired to have a high image quality to calculate a height of the uneven pattern PT with high accuracy. In this way, in order to accurately calculate the height of the uneven pattern PT, the second image has at least higher image quality than the first image.

Next, the image generation unit 40 generates a second image of the uneven pattern PT based on a detection result of secondary electrons and the like (S100). For example, FIG. 10 is a diagram showing an example of the second image. The image generation unit 40 converts a signal strength of the secondary electrons and the like detected by the detector 30 into a two-dimensional image of the surface of the wafer W. Thereby, a detected amount of the secondary electrons and the like is represented as a brightness of the two-dimensional image. In this case, as described above, the scan direction is the normal direction Dnm corresponding to the most frequent value of the first angle, and thus, in the second image, a height of the peak of the signal strength (brightness) at the contour E of the uneven pattern PT or an integral value thereof is increased. That is, the contour E of the uneven pattern PT appears clearly with high contrast in the second image.

Calculation of Height of Uneven Pattern PT

Next, the calculation unit 60 calculates a height of the uneven pattern PT based on the second image (S110). For example, FIG. 11 is a spectrum of a signal strength (brightness) obtained when acquiring the second image. A vertical axis indicates a gradation value of a signal strength (brightness). A horizontal axis indicates a position of the beam B in the scan direction (the normal direction Dnm). The calculation unit 60 calculates a height of the uneven pattern PT based on a peak value PK or an integral value INT of brightness of the second image thereof. Here, in the second image, a height of a peak of a signal strength (brightness) at the contour E of the uneven pattern PT or an integral value thereof is great, and thus, the calculation unit 60 can calculate the height of the uneven pattern PT with high accuracy.

Modification Example

Figure 13:
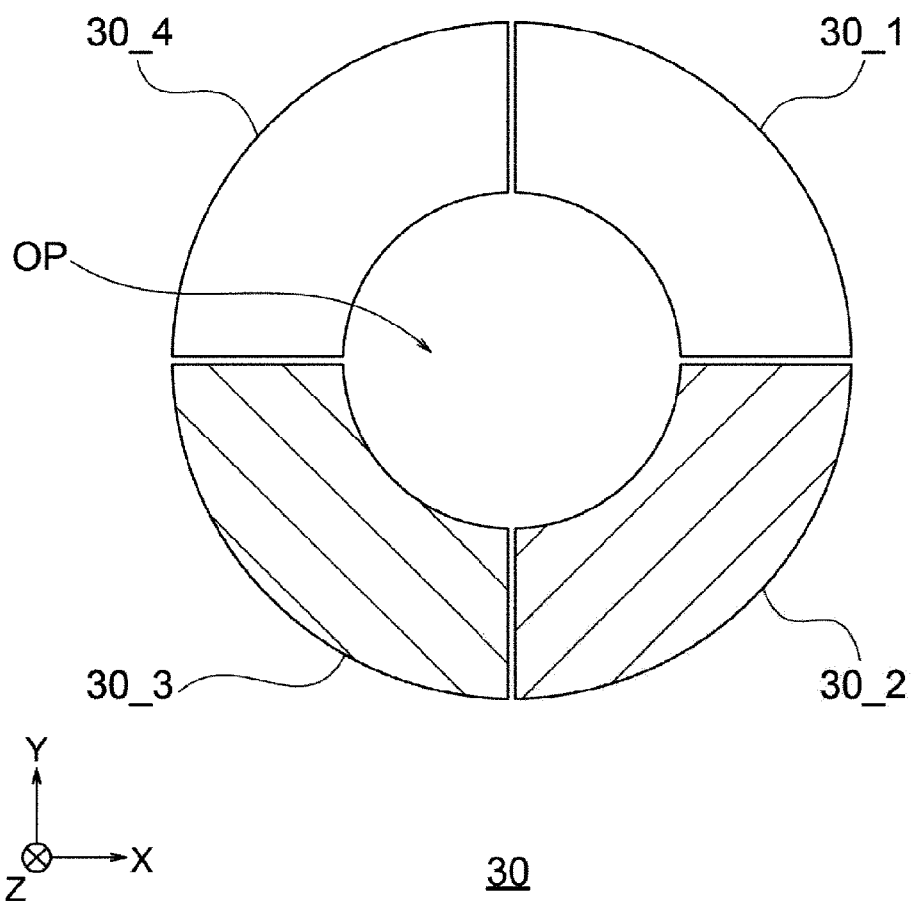
FIG. 13 is a diagram showing an example of a detector according to a modification example of the first embodiment.

FIG. 13 is a diagram showing an example of the detector 30 according to a modification example of a first embodiment. In the present modification example, when acquiring the second image, detection elements to be used are selected from the detector 30 according to the scan direction of the beam B, that is, the normal direction Dnm. For example, when the normal direction Dnm is the Y direction and the contour E of the uneven pattern PT scanned with the beam B is directed in the -Y direction as shown in FIG. 9, it can be seen that the secondary electrons and the like fly in a state of being inclined in the -Y direction from an inclined surface of the contour E of the uneven pattern PT. Thus, the detector 30 detects the secondary electrons and the like by the detection elements 30_2 and 30_3 located in the -Y direction among the detection elements 30_1 to 30_4. Thereby, a contrast of the contour E of the uneven pattern PT in the second image appears more clearly.

Although not shown, it is known previously that, when the normal direction Dnm is the Y direction and the contour E of the uneven pattern PT scanned with the beam B is directed in the +Y direction, the secondary electrons and the like fly in a state of being inclined in the +Y direction from the inclined surface of the contour E of the uneven pattern PT. Thus, the detector 30 detects the secondary electrons and the like by the detection elements 30_1 and 30_4 located in the +Y direction among the detection elements 30_1 to 30_4.

Further, it is known previously that, when the normal direction Dnm is the X direction and the contour E of the uneven pattern PT scanned with the beam B is directed in the -X direction, the secondary electrons and the like fly in a state of being inclined in the -X direction from the inclined surface of the contour E of the uneven pattern PT. Thus, the detector 30 detects the secondary electrons and the like by the detection elements 30_3 and 30_4 located in the -X direction among the detection elements 30_1 to 30_4.

Furthermore, it is known previously that, when the normal direction Dnm is the X direction and the contour E of the uneven pattern PT scanned with the beam B is directed in the +X direction, the secondary electrons and the like fly in a state of being inclined in the +X direction from the inclined surface of the contour E of the uneven pattern PT. Thus, the detector 30 detects the secondary electrons and the like by the detection elements 30_1 and 30_2 located in the +X direction among the detection elements 30_1 to 30_4.

In this way, the image generation unit 40 selects detection elements to be used from the detector 30 according to a scan direction of the beam B, that is, the normal direction Dnm when generating the second image.

Thereby, the contour E of the uneven pattern PT in the second image appears clearly with a higher contrast. As a result, a height of a peak of a signal strength (brightness) at the contour E of the uneven pattern PT or an integral value thereof increases, and thus, the calculation unit 60 can calculate a height of the uneven pattern PT with higher accuracy.

In the present modification example, two detection elements are selectively used. However, one detection element or three or more detection elements may be selectively used.

Second Embodiment

Figure 14:
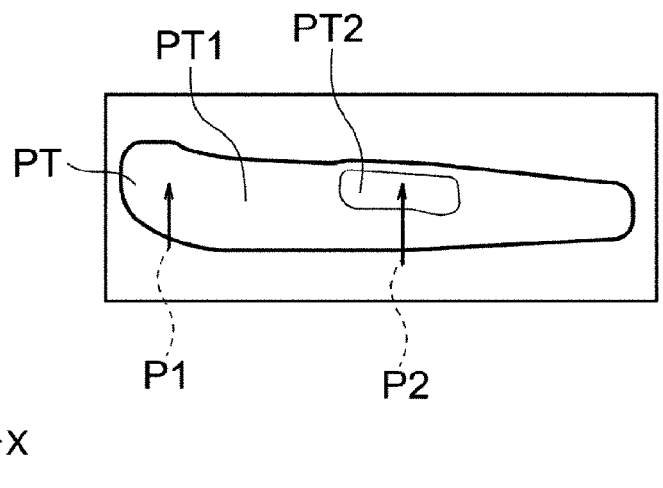
FIG. 14 is a diagram showing the uneven pattern of the first image and a line segment in the normal direction.
Figure 15:
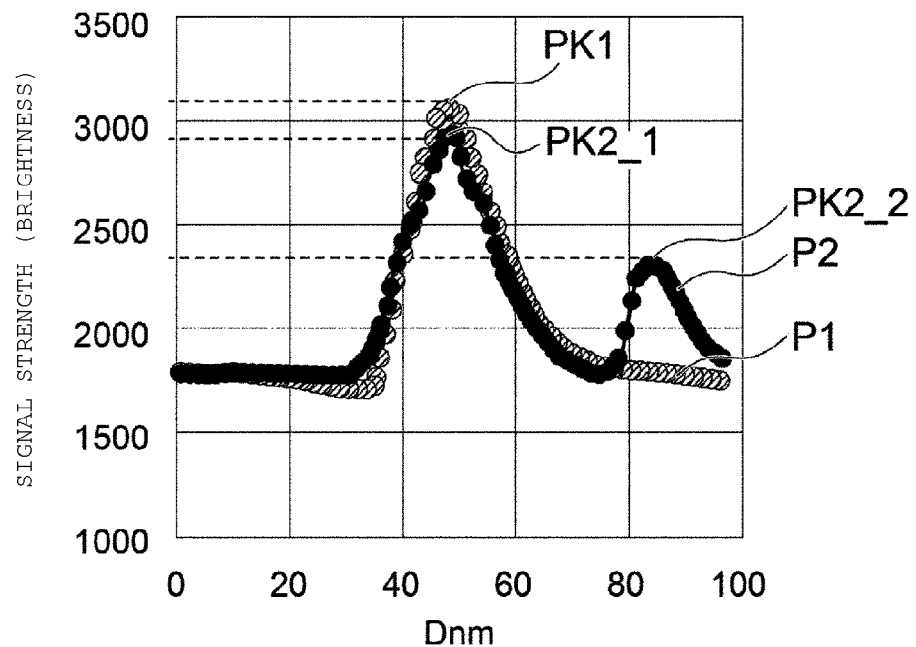
FIG. 15 is a spectrum of a signal strength (brightness) of each line segment in the normal direction.
Figure 16:
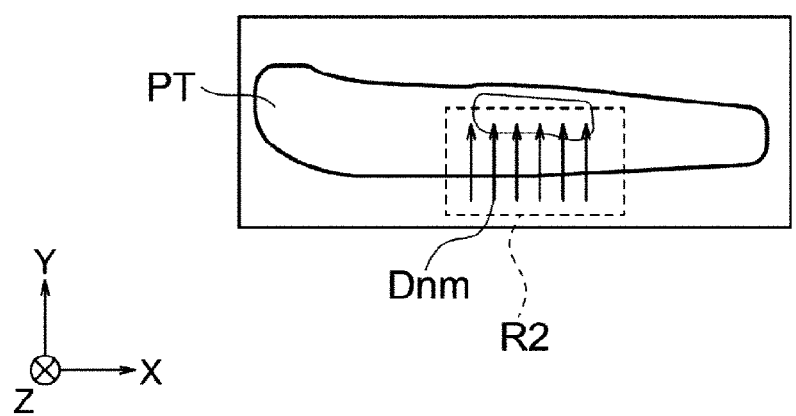
FIG. 16 is a conceptual diagram showing a scan region and a scan direction when acquiring a second image.

FIGS. 14 to 16 are diagrams showing an example of an inspection method using the inspection device 1 according to a second embodiment. FIG. 17 is a flowchart showing an example of an inspection method according to the second embodiment. A configuration of the inspection device 1 according to the second embodiment may be the same as in the first embodiment, for example.

An acquisition method of a first image in the second embodiment may be the same as in the first embodiment. Further, the second embodiment may be the same as the first embodiment in determining the normal direction Dnm corresponding to the most frequent value of a first angle among the normal directions Dn as a scan direction using a first image. Thus, in the second embodiment, step S10 to step S70 of FIG. 12 are performed in the same manner as in the first embodiment.

Next, the calculation unit 60 obtains the sum of peak values in the normal direction Dnm or an integral value thereof from a signal strength of a first image (S71). For example, the calculation unit 60 calculates the sum (when there is only one peak, a peak value thereof) of the peak values of the signal strength in the normal direction Dnm or an integral value of the signal strength in the normal direction Dnm using the signal strength of the first image. Thereby, although image quality of the first image is relatively low, an approximate position in which the sum of peak values of a signal strength (brightness) or an integral value thereof is maximized can be determined.

FIG. 14 is a diagram showing the uneven pattern PT of the first image and line segments P1 and P2 in the normal direction Dnm. FIG. 15 shows spectra of signal strengths (brightness) of the line segments P1 and P2 in the normal direction Dnm. As shown in FIG. 14, the uneven pattern PT has a lower pattern PT1 of a protrusion portion protruding from the surface of the wafer W, and further has an upper pattern PT2 further protruding above the protrusion portion. That is, in the uneven pattern PT, the pattern PT2 protrudes the highest.

For example, the first image is an image obtained by performing a scan with the beam B in the X direction, but when a signal strength of each unit region of the first image is viewed as an arrangement in the normal direction Dnm, the signal strength (brightness) in the normal direction Dnm is obtained in each column as shown in FIG. 15. For example, as shown in FIG. 15, the line segment P1 includes only the lower pattern PT1, and thus, a graph of the signal strength has only a peak PK1. Since the line segment P2 includes both the lower pattern PT1 and the upper pattern PT2, the graph of the signal strength has a peak PK2_1 and a peak PK2_2.

The calculation unit 60 calculates the sum of peak values of the signal strength in the normal direction Dnm or an integral value thereof. For example, the calculation unit 60 calculates a value of the peak PK1 in the line segment P1 or calculates an integral value of the signal strength of the line segment P1. The calculation unit 60 calculates the sum (PK2_1+PK2_2) of the peaks PK2_1 and PK2_2 in the line segment P2 or calculates an integral value of a signal strength of the line segment P2.

In FIGS. 14 and 15, the calculation unit 60 represents the signal strengths of two line segments P1 and P2, but may calculate signal strengths of three or more line segments in the normal direction Dnm.

Next, the calculation unit 60 regards a location (line segment) where the sum of peak values in the normal direction Dnm is maximum and a vicinity of the location as a region where the uneven pattern PT has the highest height. Then, the calculation unit 60 determines the normal direction Dnm as a scan direction when acquiring a second image and determines the location where the sum of the peak values of the signal strength (brightness) is maximum and a peripheral region thereof (a region where a height of the uneven pattern PT is regarded as the greatest height) as the scan region when acquiring the second image (S71). FIG. 16 is a conceptual diagram showing a scan region R2 and a scan direction when acquiring a second image. The second image is acquired by raster-scanning the inside of the scan region R2 acquired in step S71 in the normal direction Dnm (S81).

Alternatively, the calculation unit 60 may determine a location (line segment) having a signal strength or an integral value of a certain percentage or more (for example, 80% or more) with respect to a peak value of the signal strength in the normal direction Dnm as the scan region when acquiring the second image.

Next, steps S100 to S110 are performed. Thereby, the second image of the scan region can be acquired, and a height of the highest position of the uneven pattern PT can be calculated. In this case, the second image can be acquired with greater image quality in a short time by scanning a narrower region than a region of the first image. Thus, a height of the uneven pattern PT can be detected more accurately.

In this way, in the second embodiment, the calculation unit 60 calculates the sum of peak values or an integral value of a signal strength (brightness) of a first image for each column of a plurality of unit regions arranged in the normal direction Dnm which is a scan direction when acquiring a second image, and sets a position where the sum of the peak values or the integral value thereof is maximum and a vicinity of the position as a scan region to selectively scan the position or the vicinity with the beam B. The calculation unit 60 calculates a height of the uneven pattern PT using the second image obtained by doing so. Thereby, the highest position of the uneven pattern PT can be detected with high accuracy. Further, since the scan region when acquiring the second image is a part of the first image, the second image can be acquired with high image quality in a short time.

Furthermore, the second embodiment can obtain the same effect as the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An inspection device comprising:
    an emitter configured to emit first charging particles;
    a deflector configured to deflect the first charging particles to scan a surface of a target object with the first charging particles;
    a detector configured to detect second charging particles generated from the surface of the target object based on receiving the first charging particles;
    an image generator configured to generate an image of the surface of the target object based on a detection result of the second charging particles by the detector;
    a controller configured to control a scan direction of the first charging particles; and
    a processing circuit configured to:
        detect normal directions to a contour of an uneven portion on the surface of the target object in a first image obtained by scanning the surface of the target object with the first charging particles in a first scan direction for a plurality of unit regions of the first image,
        calculate a frequency of a first angle formed by a reference axis of the first image and a normal direction of each of the plurality of unit regions,
        determine the normal direction corresponding to a most frequent value of the first angle among the normal directions as a second scan direction, and
        calculate a height of the uneven portion based on a second image obtained by scanning the surface of the target object with the first charging particles in the second scan direction.

2. The device of claim 1, wherein
    the processing circuit is configured to:
        determine the contour of the uneven portion based on a peak value or an integral value of brightness of the first image, and
        calculate the height of the uneven portion based on a peak value or an integral value of brightness of the second image.

3. The device of claim 1, wherein
the processing circuit is configured to detect the normal directions to the contour of the uneven portion in units of pixels of the first image.

4. The device of claim 1, wherein
the deflector is configured to:
repeatedly scan the surface of the target object with the first charging particles in the first scan direction when the first image is generated, and
repeatedly scan the surface of the target object with the first charging particles in the second scan direction when the second image is generated.

5. The device of claim 1, wherein
the detector is configured with a plurality of detection elements, and when the second image is generated, the image generator selects one or a plurality of detection elements to be used from among the plurality of detection elements according to the second scan direction.

6. The device of claim 5, wherein
the image generator is configured to select at least one detection element located on a side facing an inclined surface of the uneven portion in the second scan direction from among the plurality of detection elements.

7. The device of claim 1, wherein
the second image has higher definition than the first image.

8. The device of claim 1, wherein
the processing circuit is configured to:
calculate a sum of peak values of brightness of the first image, or an integral value of the brightness of the first image, for each column of the plurality of unit regions in the second scan direction, and
the deflector is configured to:
selectively scan a position where the sum of the peak values, or the integral value, is maximum, and scan a vicinity of the position with the first charging particles to generate the second image.

9. The device of claim 1, wherein
the target object is a semiconductor substrate, and the uneven portion is a defect generated on the semiconductor substrate.

10. The device of claim 9, wherein
the second scan direction is a direction substantially orthogonal to a longitudinal direction of the defect.

11. An inspection method using an inspection device including an emitter that emits first charging particles, a deflector that deflects the first charging particles, a detector that detects second charging particles generated from a surface of a target object receiving the first charging particles, an image generator that generates an image of the surface of the target object based on a detection result of the second charging particles by the detector, and a controller that controls a scan direction of the first charging particles, the inspection method comprising:
scanning the surface of the target object with the first charging particles in a first scan direction to generate a first image;
detecting normal directions to a contour of an uneven portion on the surface of the target object for a plurality of unit regions of the first image, using the first image;
calculating a frequency of a first angle formed by a reference axis of the first image and a normal direction of each of the plurality of unit regions;
determining the normal direction corresponding to a most frequent value of the first angle among the normal directions as a second scan direction;
scanning the surface of the target object with the first charging particles in the second scan direction to generate a second image; and
calculating a height of the uneven portion based on the second image.

12. The method of claim 11, wherein
the contour of the uneven portion is detected based on a peak value or an integral value of brightness of the first image, and
the height of the uneven portion is calculated based on a peak value or an integral value of brightness of the second image.

13. The method of claim 11, wherein
the normal directions to the contour of the uneven portion is detected in units of pixels of the first image.

14. The method of claim 11, wherein,
when the first image is generated, scanning repeatedly the surface of the target object with the first charging particles in the first scan direction, and
when the second image is generated, scanning repeatedly the surface of the target object with the first charging particles in the second scan direction.

15. The method of claim 11, wherein
the detector includes a plurality of detection elements, and
in generating the second image, a detection result by one or a plurality of detection elements selected from among the plurality of detection elements according to the second scan direction is used.

16. The method of claim 15, wherein
the detection result by the detection element located on a side facing an inclined surface of the uneven portion in the second scan direction among the plurality of detection elements is used.

17. The method of claim 11, wherein
the second image has a higher definition than the first image.

18. The method of claim 11, wherein
in generating the second image,
calculating a sum of peak values of brightness of the first image or an integral value of the brightness of the first image for each column of the plurality of unit regions in the second scan direction, and
selectively scanning with the first charging particles a position where the sum of the peak values or the integral value is maximum and a vicinity of the position.

19. The method of claim 11, wherein
the target object is a semiconductor substrate, and the uneven portion is a defect generated on the semiconductor substrate.

20. The method of claim 19, wherein
the second scan direction is a direction substantially orthogonal to a longitudinal direction of the defect.

* * * * *